United States Patent
Jan et al.

(10) Patent No.: US 10,930,729 B2
(45) Date of Patent: Feb. 23, 2021

(54) FIN-BASED THIN FILM RESISTOR

(71) Applicant: Intel Corporation, Santa Clara, CA (US)

(72) Inventors: Chia-Hong Jan, Portland, OR (US); Walid M. Hafez, Portland, OR (US); Neville L. Dias, Hillsboro, OR (US); Rahul Ramaswamy, Portland, OR (US); Hsu-Yu Chang, Hillsboro, OR (US); Roman W. Olac-Vaw, Hillsboro, OR (US); Chen-Guan Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 16/328,704

(22) PCT Filed: Oct. 21, 2016

(86) PCT No.: PCT/US2016/058259
§ 371 (c)(1),
(2) Date: Feb. 26, 2019

(87) PCT Pub. No.: WO2018/075072
PCT Pub. Date: Apr. 26, 2018

(65) Prior Publication Data
US 2019/0206980 A1    Jul. 4, 2019

(51) Int. Cl.
*H01L 49/02* (2006.01)
*H01L 21/285* (2006.01)
(Continued)

(52) U.S. Cl.
CPC ........ *H01L 28/24* (2013.01); *C23C 16/45525* (2013.01); *H01L 21/28556* (2013.01); *H01L 21/30608* (2013.01); *H01L 27/0629* (2013.01)

(58) Field of Classification Search
CPC ............... H01L 28/24; H01L 21/28556; H01L 21/30608
(Continued)

(56) References Cited

U.S. PATENT DOCUMENTS 9,837,405 B1 * 12/2017 Cheng ................. H01L 27/0886
9,842,931 B1 * 12/2017 Anderson ......... H01L 21/76224
(Continued)

OTHER PUBLICATIONS

International Preliminary Search Report for International Patent Application No. PCT/US2016/058259, dated May 2, 2019, 8 pages.
(Continued)

*Primary Examiner* — Igwe U Anya
(74) *Attorney, Agent, or Firm* — Schwabe, Williamson & Wyatt, P.C.

(57) ABSTRACT

Fin-based thin film resistors, and methods of fabricating fin-based thin film resistors, are described. In an example, an integrated circuit structure includes a fin protruding through a trench isolation region above a substrate. The fin includes a semiconductor material and has a top surface, a first end, a second end, and a pair of sidewalls between the first end and the second end. An isolation layer is conformal with the top surface, the first end, the second end, and the pair of sidewalls of the fin. A resistor layer is conformal with the isolation layer conformal with the top surface, the first end, the second end, and the pair of sidewalls of the fin. A first anode cathode electrode is electrically connected to the resistor layer. A second anode or cathode electrode is electrically connected to the resistor layer.

25 Claims, 8 Drawing Sheets

(51) Int. Cl.
*H01L 21/306* (2006.01)
*H01L 27/06* (2006.01)
*C23C 16/455* (2006.01)

(58) Field of Classification Search
USPC .......................................................... 257/537
See application file for complete search history.

(56) References Cited

U.S. PATENT DOCUMENTS

| | | | |
|---|---|---|---|
| 2009/0267996 A1* | 10/2009 | Bell | B41J 2/14129 |
| | | | 347/62 |
| 2010/0321447 A1* | 12/2010 | Cornell | B41J 2/14129 |
| | | | 347/64 |
| 2012/0175749 A1* | 7/2012 | Haensch | H01L 21/845 |
| | | | 257/623 |
| 2014/0084381 A1 | 3/2014 | Yeh et al. | |
| 2014/0111301 A1* | 4/2014 | Williams | H01L 23/64 |
| | | | 338/308 |
| 2015/0061076 A1* | 3/2015 | Cheng | H01L 27/0802 |
| | | | 257/538 |
| 2015/0333057 A1 | 11/2015 | Hoentschel et al. | |
| 2016/0020109 A1 | 1/2016 | Yoo | |

OTHER PUBLICATIONS

International Search Report and Written Opinion for International Patent Application No. PCT/US2016/058259 dated Jul. 17, 2017, 11 pgs.

\* cited by examiner

US 10,930,729 B2

FIN-BASED THIN FILM RESISTOR

CROSS-REFERENCE TO RELATED APPLICATION

This patent application is a U.S. National Phase Application under 35 U.S.C. § 371 of International Application No. PCT/US2016/058259, filed Oct. 21, 2016, entitled "FIN-BASED THIN FILM RESISTOR," which designates the United States of America, the entire disclosure of which is hereby incorporated by reference in its entirety and for all purposes.

TECHNICAL FIELD

Embodiments of the disclosure are in the field of semiconductor devices and processing and, in particular, fin-based thin film resistors and methods of fabricating fin-based thin film resistors.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process.

Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

Additionally, the constraints on including passive features among active devices have increased.

DESCRIPTION OF THE EMBODIMENTS

Figure 1:
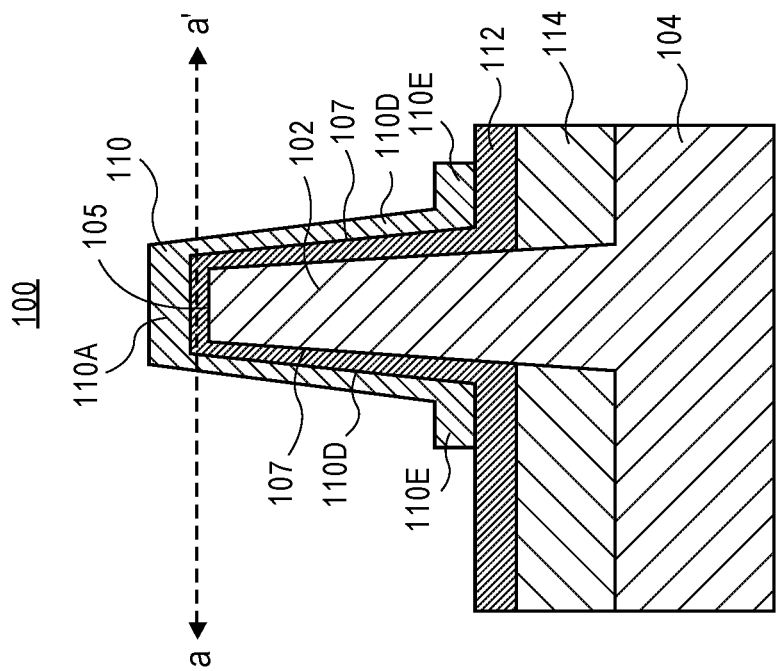
FIG. 1 illustrates a partially cut plan view and a corresponding cross-sectional view of a fin-based thin film resistor structure, where the cross-sectional view is taken along the a-a' axis of the partially cut plan view, in accordance with an embodiment of the present disclosure.
Figure 1:
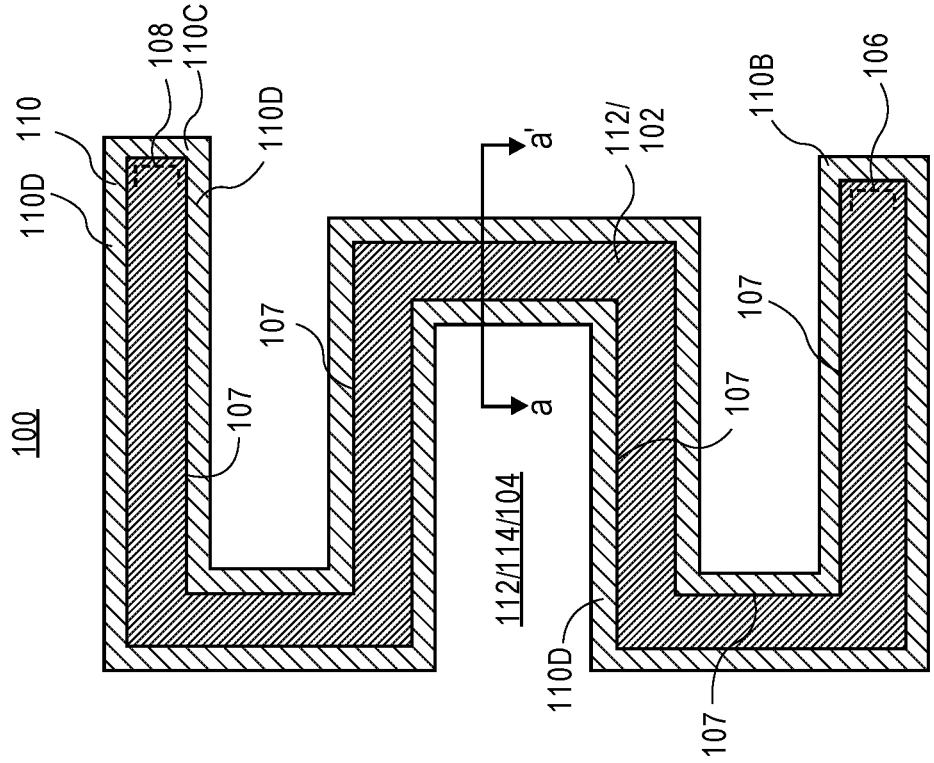

Fin-based thin film resistors, and methods of fabricating fin-based thin film resistors, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments are directed to the fabrication of metal resistors on a fin-based structure included in a fin field effect transistor (FET) architecture. In an embodiment, such precision resistors are implanted as a fundamental component of a system-on-chip (SoC) technology, due to the high speed IOs required for faster data transfer rates. Such resistors may enable the realization of high speed analog circuitry (such as CSI/SERDES) and scaled IO architectures due to the characteristics of having low variation and near-zero temperature coefficients. In one embodiment, a resistor described herein is a tunable resistor.

To provide context, traditional resistors used in current process technologies typically fall in one of two classes; general resistors or precision resistors. General resistors, such as trench contact resistors, are cost-neutral but may suffer from high variation due to variations inherent in the fabrication methods utilized or the associated large temperature coefficients of the resistors, or both. Precision resistors may alleviate the variation and temperature coefficient issues, but often at the expense of higher process cost and an increased number of fabrication operations required. The integration of polysilicon precision resistors is proving increasingly difficult in high-k/metal gate process technologies.

In accordance with embodiments, fin-based thin film resistors (TFRs) are described. In one embodiment, such resistors have a near-zero temperature coefficient. In one embodiment, such resistors exhibit reduced variation from dimensional control. In accordance with one or more embodiments of the present disclosure, an integrated precision resistor is fabricated within a fin-FET transistor architecture. It is to be appreciated that traditional resistors used in high-k/metal gate process technologies are typically tungsten trench contacts (TCN), well resistors, or polysilicon precision resistors. Such resistors either add process cost or complexity, or suffer from high variation and poor temperature coefficients due to variations in the fabrication processes used. By contrast, in an embodiment, fabrication of a fin-integrated thin film resistor enables a cost-neutral, good (close to zero) temperature coefficient, and low variation alternative to known approaches.

To provide further context, state-of-the-art precision resistors have been fabricated using two-dimensional (2D) metallic thin films or highly doped poly lines. Such resistors tend to be discretized into templates of fixed values and, hence, a finer granularity of resistance values is hard to achieve.

Addressing one or more of the above issues, in accordance with one or more embodiments of the present disclosure, design of a high density precision resistor using a fin backbone, such as a silicon fin backbone, is described herein. In one embodiment, advantages of such a high density precision resistor include that the high density can be achieved by using fin packing density. Additionally, in one embodiment, such a resistor is integrated on the same level as active transistors, leading to the fabrication of compact circuitry. The use of a silicon fin backbone may permit high packing density and provide multiple degrees of freedom to control the resistance of the resistor. Accordingly, in a specific embodiment, the flexibility of a fin patterning process is leveraged to provide a wide range of resistance values, resulting in tunable precision resistor fabrication.

As an exemplary geometry for a fin-based precision resistor, FIG. 1 illustrates a partially cut plan view and a corresponding cross-sectional view of a fin-based thin film resistor structure, where the cross-sectional view is taken along the a-a' axis of the partially cut plan view, in accordance with an embodiment of the present disclosure.

Referring to FIG. 1, an integrated circuit structure 100 includes a semiconductor fin 102 protruding through a trench isolation region 114 above a substrate 104. In one embodiment, the semiconductor fin 102 protrudes from and is continuous with the substrate 104, as is depicted. The semiconductor fin has a top surface 105, a first end 106 (shown as a dashed line in the partially cut plan view since the fin is covered in this view), a second end 108 (shown as a dashed line in the partially cut plan view since the fin is covered in this view), and a pair of sidewalls 107 between the first end 106 and the second end 108. It is to be appreciated that the sidewalls 107 are actually covered by layer 112 in the partially cut plan view).

An isolation layer 112 is conformal with the top surface 105, the first end 106, the second end 108 and the pair of sidewalls 107 of the semiconductor fin 102. A metal resistor layer 110 is conformal with the isolation layer 114 conformal with the top surface 105 (metal resistor layer portion 110A), the first end 106 (metal resistor layer portion 110B), the second end 108 (metal resistor layer portion 110C), and the pair of sidewalls 107 (metal resistor layer portions 110D) of the semiconductor fin 102. In a particular embodiment, the metal resistor layer 110 includes a footed feature 110E adjacent to the sidewalls 107, as is depicted. The isolation layer 112 electrically isolates the metal resistor layer 110 from the semiconductor fin 102 and, hence, from the substrate 104.

In an embodiment, the metal resistor layer 110 is composed of a material suitable to provide a near-zero temperature coefficient, in that the resistance of the metal resistor layer portion 110 does not change significantly over a range of operating temperatures of a thin film resistor (TFR) fabricated therefrom. In an embodiment, the metal resistor layer 110 is a titanium nitride (TiN) layer. In another embodiment, the metal resistor layer 110 is a tungsten (W) metal layer. It is to be appreciated that other metals may be used for the metal resistor layer 110 in place of, or in combination with, titanium nitride (TiN) or tungsten (W). In an embodiment, the metal resistor layer 110 has a thickness approximately in the range of 2-5 nanometers. In an embodiment, the metal resistor layer 110 has a resistivity approximately in the range of 100-100.000 ohms/square.

In an embodiment, an anode electrode and a cathode electrode are electrically connected to the metal resistor layer 110, exemplary embodiments of which are described in greater detail below in association with FIG. 7. In one such embodiment, the metal resistor layer 110, the anode electrode, and the cathode electrode form a precision thin film resistor (TFR) passive device. In an embodiment, the TFR based on the structure 100 of FIG. 1 permits precise control of resistance based on fin 102 height, fin 102 width, metal resistor layer 110 thickness and total fin 102 length. These degrees of freedom may allow a circuit designer to achieve a selected resistance value. Additionally, since the resistor patterning is fin-based, high density is possible at on the scale of transistor density.

In an embodiment, state-of-the-art finFET processing operations are used to provide a fin suitable for fabricating a fin-based resistor. An advantage of such an approach may lie in its high density and proximity to the active transistors, enabling ease of integration into circuits. Also, the flexibility in the geometry of the underlying fin allows for a wide range of resistance values. In an exemplary processing scheme, a fin is first patterned using backbone lithography and spacerization approach. The fin is then covered with isolation oxide which is recessed to set the height of the resistor. An insulating oxide is then deposited conformally on the fin to separate the conductive film from the underlying substrate, such as an underlying silicon substrate. A metal or highly doped polysilicon film is then deposited on the fin. The film is then spacerized to create the precision resistor.

In an exemplary processing scheme, FIGS. 2-6 illustrate plan views and corresponding cross-sectional view representing various operations in a method of fabricating a fin-based thin film resistor structure, in accordance with an embodiment of the present disclosure.

Figure 2:
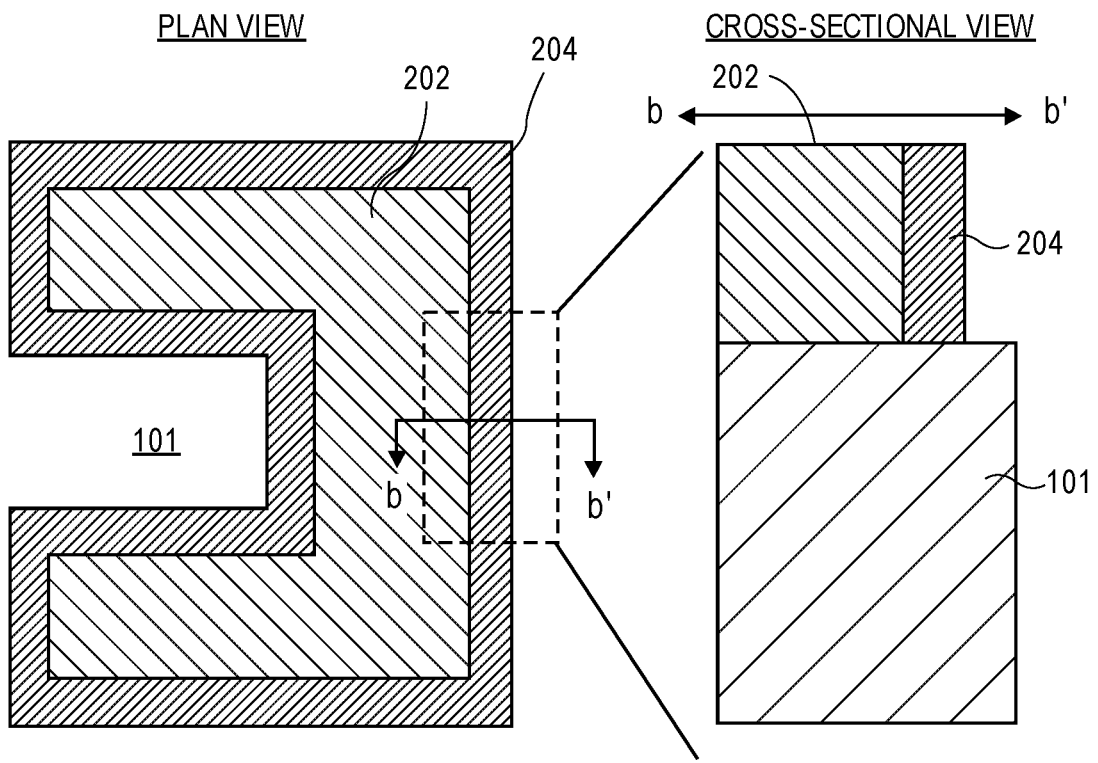
FIGS. 2-6 illustrate plan views and corresponding cross-sectional view representing various operations in a method of fabricating a fin-based thin film resistor structure, in accordance with an embodiment of the present disclosure.

Referring to FIG. 2, a plan view and corresponding cross-sectional view taken along the b-b' axis of the plan view illustrate a stage of a process flow following forming of a backbone template structure 202 on a semiconductor substrate 101. A sidewall spacer layer 204 is then formed conformal with sidewall surfaces of the backbone template structure 202. In an embodiment, following patterning of the backbone template structure 202, conformal oxide material is deposited and then anisotropically etched (spacerized) to provide the sidewall spacer layer 204.

Figure 3:
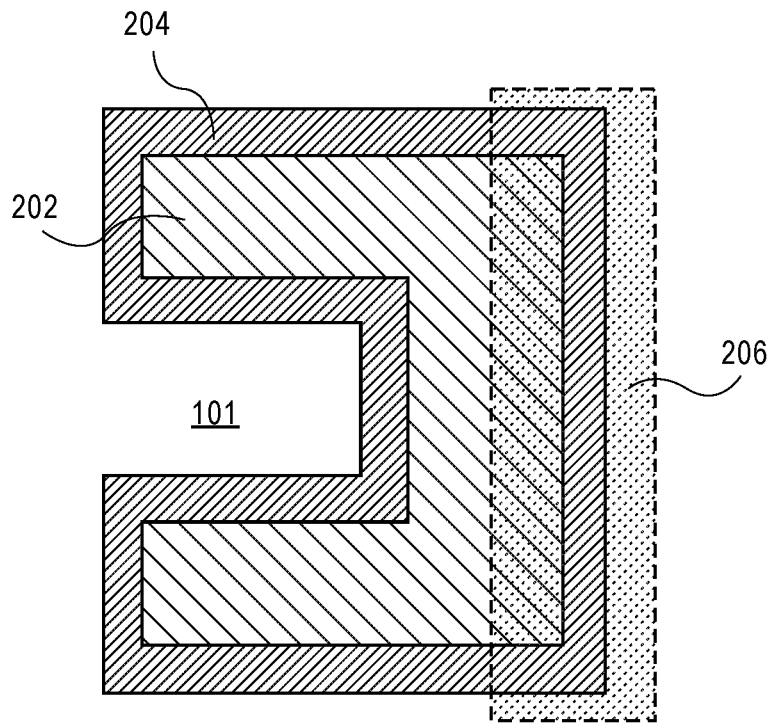

Referring to FIG. 3, a plan view illustrates a stage of the process flow following exposure of a region 206 of the sidewall spacer layer 204, e.g., by a lithographic masking and exposure process. The portions of the sidewall spacer layer 204 included in region 206 are then removed, e.g., by an etch process. The portions removed are those portions that will be used for ultimate fin definition.

Figure 4:
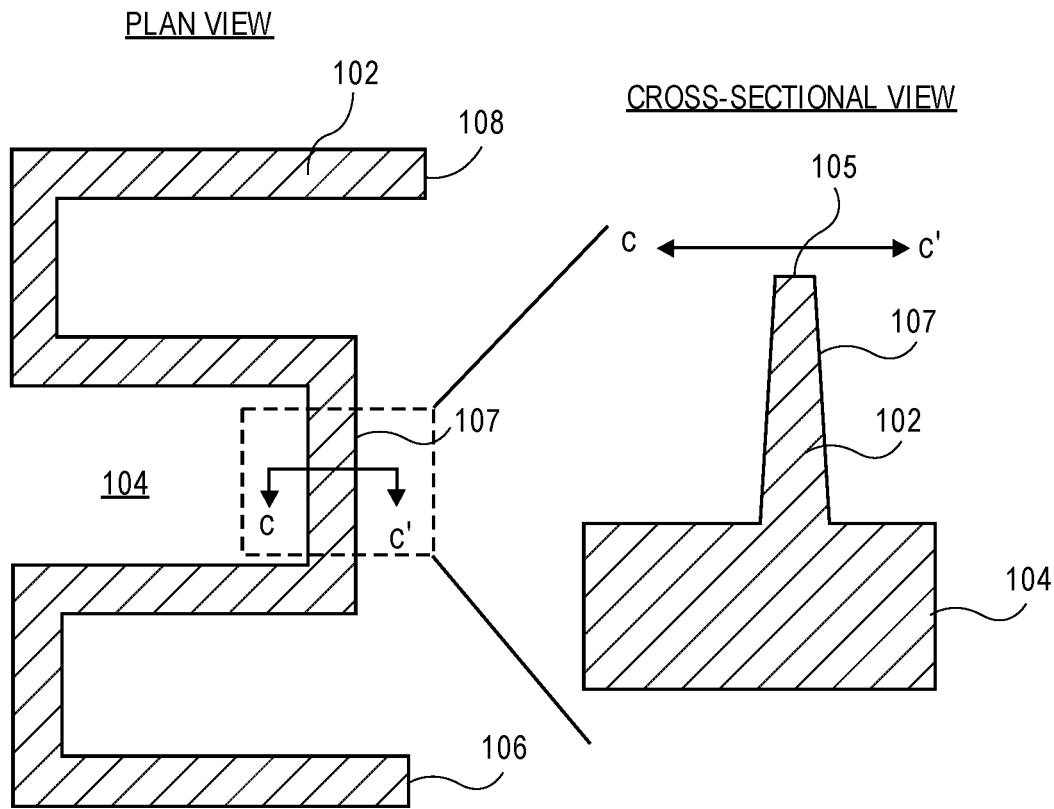

Referring to FIG. 4, a plan view and corresponding cross-sectional view taken along the c-c' axis of the plan view illustrate a stage of the process flow following removal of the portions of the sidewall spacer layer 204 included in region 206 of FIG. 3 to form a fin patterning mask (e.g., oxide fin patterning mask). The backbone template structure 202 is then removed and the remaining patterning mask is used as an etch mask to pattern the substrate 101. Upon patterning of the substrate 101 and subsequent removal of the fin patterning mask, a semiconductor fin 102 remains protruding from and continuous with a now patterned semiconductor substrate 104. The semiconductor fin 102 has a top surface 105, a first end 106, a second end 108, and a pair of sidewalls 107 between the first end and the second end, as described above in association with FIG. 1.

Figure 5:
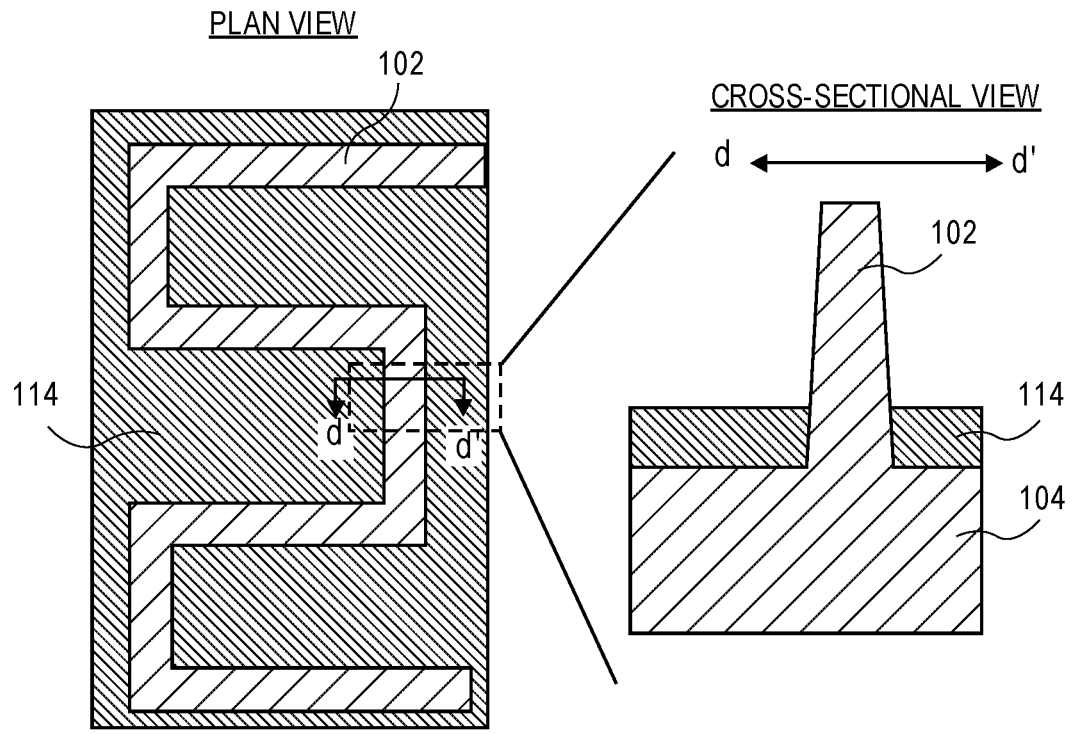

Referring to FIG. 5, a plan view and corresponding cross-sectional view taken along the d-d' axis of the plan view illustrate a stage of the process flow following formation of a trench isolation layer 114. In an embodiment, the trench isolation layer 114 is formed by depositing of an insulating material and subsequent recessing to define the fin height (Hsi) to define fin height.

Figure 6:
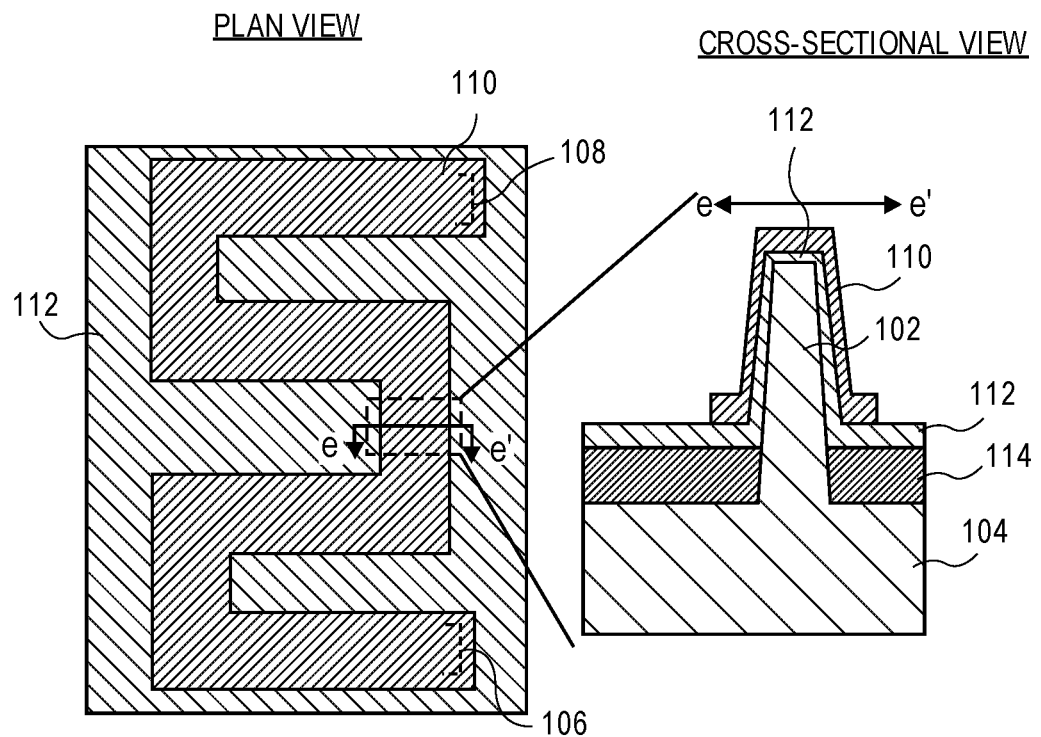

Referring to FIG. 6, a plan view and corresponding cross-sectional view taken along the e-e' axis of the plan view illustrate a stage of the process flow following formation of an isolation layer 112. In an embodiment, the isolation layer 112 is formed by a chemical vapor deposition (CVD) process. The isolation layer 112 is formed conformal with the top surface (105), the first end 106, the second end 108, and the pair of sidewalls (107) of the semiconductor fin 102. A metal resistor layer 110 is then formed conformal with the isolation layer 112 conformal with the top surface, the first end, the second end, and the pair of sidewalls of the semiconductor fin 102.

In an embodiment, the metal resistor layer 110 is formed using a blanket deposition and subsequent anisotropic etching process. In an embodiment, the metal resistor layer 110 is formed using atomic layer deposition (ALD). In an embodiment, the metal resistor layer 110 is formed to a thickness in the range of 2-5 nanometers. In an embodiment, the metal resistor layer 110 is or includes a titanium nitride (TiN) layer or a tungsten (W) layer. In an embodiment, the metal resistor layer 110 is formed to have a resistivity in the range of 100-100,000 ohms/square.

In a subsequent processing operation, a pair of anode or cathode electrodes may be formed and may be electrically connected to the metal resistor layer 110 of the structure of FIG. 6. As an example, FIG. 7 illustrates a plan view of a fin-based thin film resistor structure with a variety of exemplary locations for anode or cathode electrode contacts, in accordance with an embodiment of the present disclosure.

Figure 7:
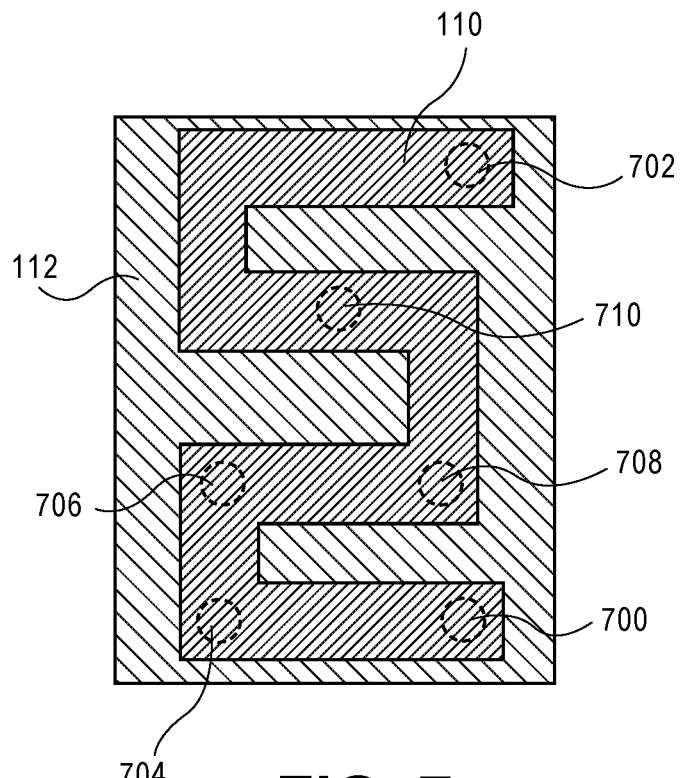
FIG. 7 illustrates a plan view of a fin-based thin film resistor structure with a variety of exemplary locations for anode or cathode electrode contacts, in accordance with an embodiment of the present disclosure.

Referring to FIG. 7, a first anode or cathode electrode, e.g., one of 700, 702, 704, 706, 708, 710, is electrically connected to the metal resistor layer 110. A second anode or cathode electrode, e.g., another of 700, 702, 704, 706, 708, 710, is electrically connected to the metal resistor layer 110. In an embodiment, the metal resistor layer 110, the anode electrode, and the cathode electrode form a precision thin film resistor (TFR) passive device. The precision TFR passive device may be tunable in that the resistance can be selected based on the distance between the first anode or cathode electrode and the second anode or cathode electrode. The options may be provided by forming a variety of actual electrodes. e.g., 700, 702, 704, 706, 708, 710 and other possibilities, and then selecting the actual pairing based on interconnecting circuitry. Alternatively, a single anode or cathode pairing may be formed, with the locations for each selected during fabrication of the TFR device. In either case, in an embodiment, the location for one of the anode or cathode electrodes is at an end of the fin 102 (e.g., at location 700 or 702), is at a corner of the fin 102 (e.g., at location 704, 706 or 708), or in a center of a transition between corners (e.g., at location 710).

In an exemplary embodiment, the first anode or cathode electrode is electrically connected to the metal resistor layer 110 proximate to the first end 106, e.g., at location 700, of the semiconductor fin 102. The second anode or cathode electrode is electrically connected to the metal resistor layer 110 proximate to the second end 108, e.g., at location 702, of the semiconductor fin 102.

In another exemplary embodiment, the first anode or cathode electrode is electrically connected to the metal resistor layer 110 proximate to the first end 106, e.g., at location 700, of the semiconductor fin 102. The second anode or cathode electrode is electrically connected to the metal resistor layer 110 distal from the second end 108, e.g., at location 710, 708, 706 or 704, of the semiconductor fin 102.

In another exemplary embodiment, the first anode or cathode electrode is electrically connected to the metal resistor layer 110 distal from the first end 106, e.g., at location 704 or 706, of the semiconductor fin 102. The second anode or cathode electrode is electrically connected to the metal resistor layer 110 distal from the second end 108, e.g., at location 710 or 708, of the semiconductor fin 102.

More specifically, in accordance with one or more embodiments of the present disclosure, a topographical feature of a fin-based transistor architecture is used as a foundation for fabricating an embedded resistor. In one embodiment, a precision resistor is fabricated on a fin structure. In a specific embodiment, such an approach enables very high density integration of a passive component such as a precision resistor.

Figure 8A:
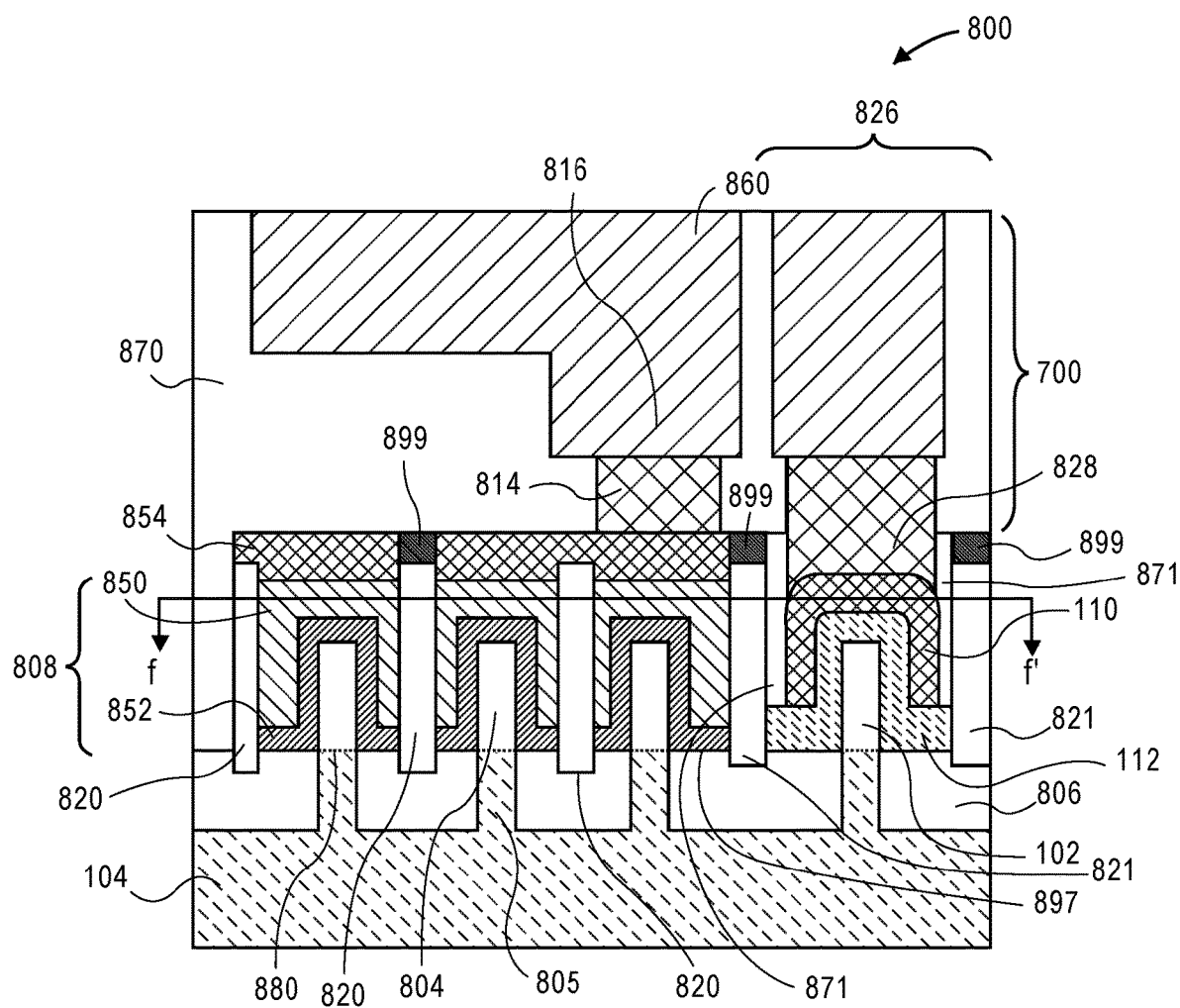
FIG. 8A illustrates a cross-sectional view of a non-planar integrated circuit structure having a fin-based transistor integrated with a fin-based thin film resistor (TFR), in accordance with an embodiment of the present disclosure.
Figure 8B:
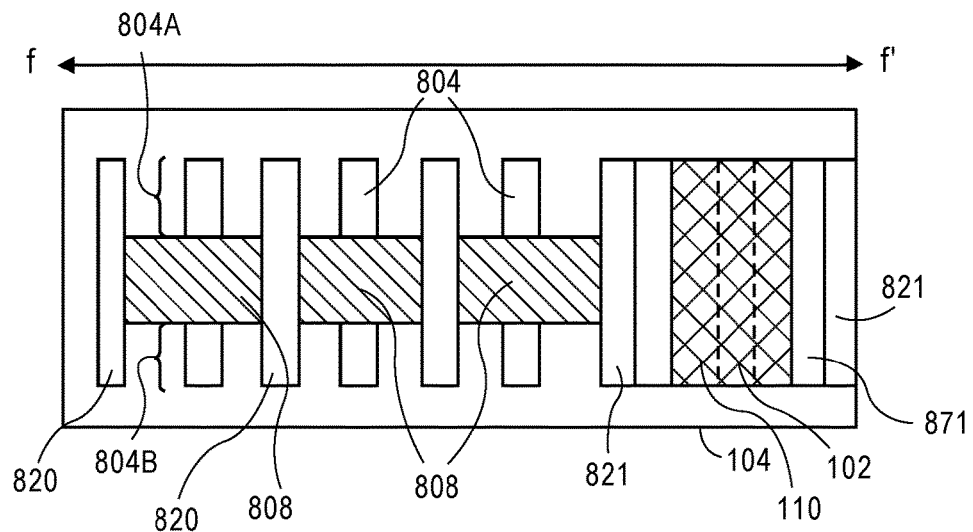
FIG. 8B illustrates a plan view taken along the f-f axis of the structure of FIG. 8A, in accordance with an embodiment of the present disclosure.

It is to be appreciated that the structures resulting from the above exemplary processing schemes may be used in a same or similar form for subsequent processing operations to complete device fabrication, such as PMOS and NMOS device fabrication, alongside passive component fabrication. As an example of a completed device and nearby passive component, FIG. 8A illustrates a cross-sectional view of a non-planar integrated circuit structure having a fin-based transistor integrated with a fin-based thin film resistor (TFR). FIG. 8B illustrates a plan view taken along the f-f' axis of the structure of FIG. 8A, in accordance with an embodiment of the present disclosure.

Referring to FIG. 8A, an integrated circuit structure 800 includes non-planar transistor active regions (e.g., fin structures each including a protruding fin portion 804 and sub-fin region 805) formed from substrate 104, and within isolation region 806. A thin film resistor (TFR) region 826 is included laterally adjacent to the non-planar transistor active regions. In an embodiment, a TFR in the TFR region 826 includes fin 102, isolation layer 112, and metal resistor layer 110. An anode or cathode electrode 700 is included and is electrically coupled to the metal resistor layer 110. In one embodiment, the anode or cathode electrode 700 includes a TFR via 828.

In one embodiment, the TFR region 826 is isolated by a pair of dielectric plugs 899 which may be formed on SAGE walls, as described below. In one embodiment, an inter-layer dielectric (ILD) material 871 is included around metal resistor layer 110.

In an embodiment, the fin structures 804/805 of the transistor region are a plurality of fin lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like fin patterns may have lines spaced at a constant pitch and having a constant width. The pattern may be fabricated by a pitch halving or pitch quartering, or other pitch division, approach.

Gate structures 808 are disposed over the protruding portions 804 of the non-planar active regions as well as over a portion of the isolation region 806. As shown, gate structures 808 include a gate electrode 850 and a gate dielectric layer 852. In one embodiment, although not shown, gate structures 808 may also include a dielectric cap layer.

In an embodiment, gate structures 808 are separated by self-aligned gate edge (SAGE) isolation structures or walls 820. Each SAGE wall 820 may include a local interconnect 854 or a dielectric plug 899 formed thereon. In an embodiment, such SAGE walls 821 separate an end of a gate structure 808 from the region of the TFR 826, as is depicted. In one such embodiment, the TFR 826 is further isolated by dielectric plugs 899 formed on the SAGE walls 821, as is also depicted. With respect to a SAGE process, one or more embodiments described herein provide an avenue for area scaling, reducing capacitance, and/or eliminating various critical front end masks, such as gate cut masks. In one such embodiment the width of a minimum transistor can be reduced by up to 30% by implementing one or more of the approaches describe herein. In one embodiment, no extra mask operations are required to fabricate the SAGE isolation structures or walls 820. In a specific embodiment, each of the SAGE walls 820 and 821 is recessed below an uppermost surface 897 of the isolation region 806, as is depicted in FIG. 8A.

A gate contact 814, and overlying gate contact via 816 are also seen from this perspective, along with an overlying metal interconnect 860, all of which are disposed in interlayer dielectric stacks or layers 870. Also seen from the perspective of FIG. 8A, the gate contact 814 is, in one embodiment, disposed over the non-planar active regions. As is also depicted in FIG. 8A, an interface 880 exists between a doping profile of protruding fin portions 804 and sub-fin regions 805, although other embodiments do not include such an interface in doping profile between these regions.

Referring to FIG. 8B, the gate structures 808 are shown as disposed over the protruding fin portions 804, as isolated by self-aligned gate edge isolation structures 820. Gate edge isolation structures 821 isolate the TFR region 826, for which the fin 102, the metal resistor layer 110, and interlayer dielectric material 871 can be seen from this perspective. In an embodiment, the gate structures 808 form one line of a plurality of parallel gate lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like gate patterns may have lines spaced at a constant pitch and having a constant width. The pattern may be fabricated by a pitch halving or pitch quartering, or other pitch division, approach.

Referring again to FIG. 8B, source and drain regions 804A and 804B of the protruding fin portions 804 are shown in this perspective, although it is to be appreciated that these regions would be overlapped with trench contact structures. In one embodiment, the source and drain regions 804A and 804B are doped portions of original material of the protruding fin portions 804. In another embodiment, the material of the protruding fin portions 804 is removed and replaced with another semiconductor material, e.g., by epitaxial deposition. In either case, the source and drain regions 804A and 804B may extend below the height of dielectric layer 806, i.e., into the sub-fin region 805.

In an embodiment, the integrated circuit structure 800 includes active non-planar devices such as, but not limited to, a finFET or a tri-gate devices. In such an embodiment, a corresponding semiconducting channel region is composed of or is formed in a three-dimensional body. In one such embodiment, the gate structures 808 surround at least a top surface and a pair of sidewalls of the three-dimensional body.

Substrate 104 may be composed of a semiconductor material that can withstand a manufacturing process and in which charge can migrate. In an embodiment, substrate 104 is a bulk substrate composed of a crystalline silicon, silicon/germanium or germanium layer doped with a charge carrier, such as but not limited to phosphorus, arsenic, boron or a combination thereof, to form active region 804. In one embodiment, the concentration of silicon atoms in bulk substrate 104 is greater than 97%. In another embodiment, bulk substrate 104 is composed of an epitaxial layer grown atop a distinct crystalline substrate, e.g. a silicon epitaxial layer grown atop a boron-doped bulk silicon mono-crystalline substrate. Bulk substrate 104 may alternatively be composed of a group III-V material. In an embodiment, bulk substrate 104 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 104 is composed of a III-V material and the charge-carrier dopant impurity atoms are ones such as, but not limited to, carbon, silicon, germanium, oxygen, sulfur, selenium or tellurium.

Isolation region 806 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 806 is composed of a dielectric material such as, but not limited to, silicon dioxide, silicon oxy-nitride, silicon nitride, or carbon-doped silicon nitride.

Self-aligned gate edge isolation structures 820 and 821 may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride.

Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

Gate structures 808 may be composed of a gate electrode stack which includes a gate dielectric layer 852 and a gate electrode layer 850. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 104. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In an embodiment, the top high-k portion consists of a "U"-shaped structure that includes a bottom portion substantially parallel to the surface of the substrate and two sidewall portions that are substantially perpendicular to the top surface of the substrate.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 814, overlying gate contact via 816, overlying metal interconnect 860 and TFR anode or cathode 700 (including via 828) may be composed of a conductive material. In an embodiment, one or more of the contacts, anodes/cathodes or vias are composed of a metal species. The metal species may be a pure metal, such as tungsten, nickel, or cobalt, or may be an alloy such as a metal-metal alloy or a metal-semiconductor alloy (e.g., such as a silicide material). A common example is the use of tungsten or copper structures that may or may not include barrier layers (such as Ta or TaN layers) between the tungsten or copper and surrounding ILD material. As used herein, the term metal includes alloys, stacks, and other combinations of multiple metals. For example, the metal interconnect lines may include barrier layers, stacks of different metals or alloys, etc.

In an embodiment (although not shown), providing structure 800 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate structures 808 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 800. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 8A, in an embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that a variety of fin geometries are suitable for fabricating a fin-based precision resistor. FIGS. 9A-9D illustrate plan views of various fin geometries for fabricating a fin-based precision resistor, in accordance with an embodiment of the present disclosure.

Figure 9A:
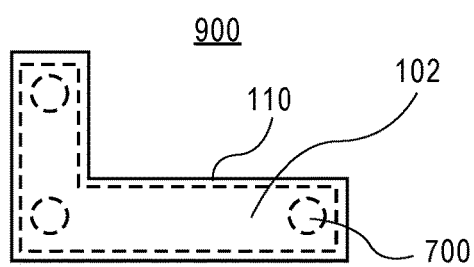
FIGS. 9A-9D illustrate plan views of various fin geometries for fabricating a fin-based precision resistor, in accordance with an embodiment of the present disclosure.
Figure 9B:
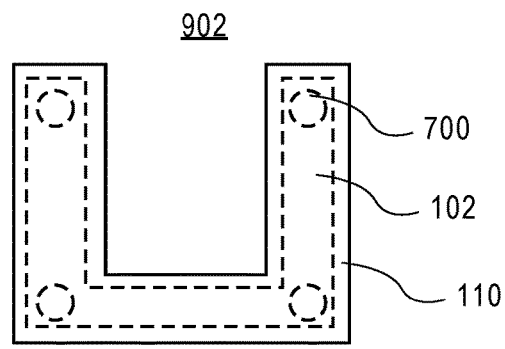
Figure 9C:
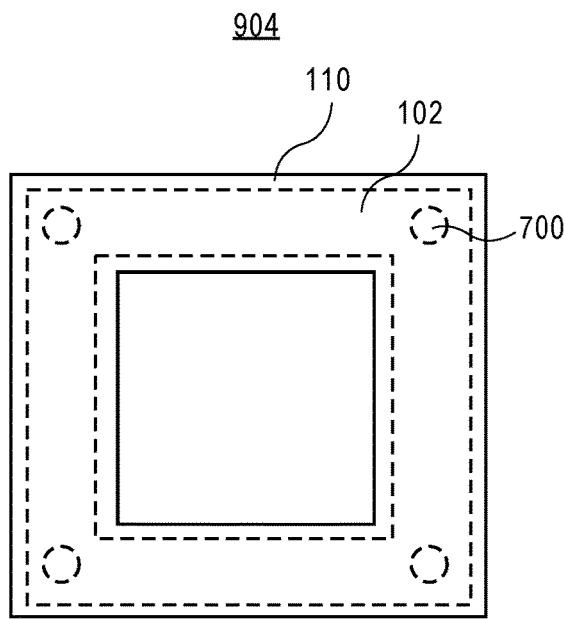

In an embodiment, referring to FIGS. 9A-9C, a semiconductor fin 102 is a non-linear semiconductor fin. In one embodiment, the semiconductor fin 102 protrudes through a trench isolation region above a substrate. A metal resistor layer 110 is conformal with an isolation layer (not shown) conformal with the non-linear semiconductor fin 102. In one embodiment, two or more anode or cathode electrodes 700 are electrically connected to the metal resistor layer 110, with exemplary optional locations shown by the dashed circles in FIGS. 9A-9C.

A non-linear fin geometry includes one or more corners, such as, but not limited to, a single corner (e.g., L-shaped), two corners (e.g., U-shaped), four corners (e.g., S-shaped), or six corners (e.g., the structure of FIG. 1). In an embodiment, the non-linear fin geometry is an open structure geometry. In another embodiment, the non-linear fin geometry is a closed structure geometry.

As exemplary embodiments of an open structure geometry for a non-linear fin geometry, FIG. 9A illustrates a non-linear fin having one corner to provide an open structure L-shaped geometry. FIG. 9B illustrates a non-linear fin having two corners to provide an open structure U-shaped geometry. In the case of an open structure, the non-linear semiconductor fin 102 has a top surface, a first end, a second end, and a pair of sidewalls between the first end and the second end. A metal resistor layer 110 is conformal with an isolation layer (not shown) conformal with the top surface, the first end, the second end, and the pair of sidewalls between the first end and the second end.

In a specific embodiment, referring again to FIGS. 9A and 9B, a first anode or cathode electrode is electrically connected to the metal resistor layer 110 proximate to a first end of an open structure non-linear semiconductor fin, and a second anode or cathode electrode is electrically connected to the metal resistor layer 110 proximate to a second end of the open structure non-linear semiconductor fin. In another specific embodiment, a first anode or cathode electrode is electrically connected to the metal resistor layer 110 proximate to a first end of an open structure non-linear semiconductor fin, and a second anode or cathode electrode is electrically connected to the metal resistor layer 110 distal from a second end of the open structure non-linear semiconductor fin. In another specific embodiment, a first anode or cathode electrode is electrically connected to the metal resistor layer 110 distal from a first end of an open structure non-linear semiconductor fin, and a second anode or cathode electrode is electrically connected to the metal resistor layer 110 distal from a second end of the open structure non-linear semiconductor fin.

As an exemplary embodiment of a closed structure geometry for a non-linear fin geometry, FIG. 9C illustrates a non-linear fin having four corners to provide a closed structure square-shaped or rectangular-shaped geometry. In the case of a closed structure, the non-linear semiconductor fin 102 has a top surface and a pair of sidewalls and, in particular, an inner sidewall and an outer sidewall. However, the closed structure does not include exposed first and second ends. A metal resistor layer 110 is conformal with an isolation layer (not shown) conformal with the top surface, the inner sidewall, and the outer sidewall of the fin 102.

Figure 9D:
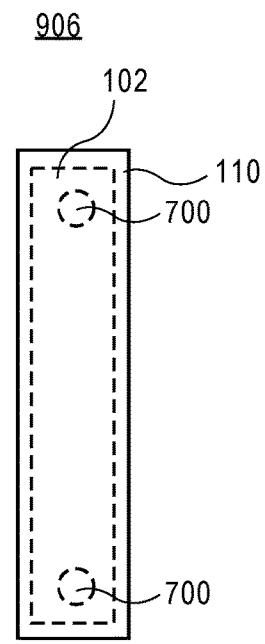

In another embodiment, referring to FIG. 9D, a semiconductor fin 102 is a linear semiconductor fin. In one embodiment, the semiconductor fin 102 protrudes through a trench isolation region above a substrate. A metal resistor layer 110 is conformal with an isolation layer (not shown) conformal with the linear semiconductor fin 102. In one embodiment, two or more anode or cathode electrodes 700 are electrically connected to the metal resistor layer 110, with exemplary optional locations shown by the dashed circles in FIG. 9D.

It is to be appreciated that the layers and materials described herein and as used throughout the present disclosure are typically formed on or above an underlying semiconductor substrate or structure. In an embodiment, an underlying semiconductor substrate, such as pre-patterned substrate 101 or patterned substrate 104 of the Figures described above, represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The substrate may also include semiconductor materials, metals, dielectrics, dopants, and other materials commonly found in semiconductor substrates.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers may be formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
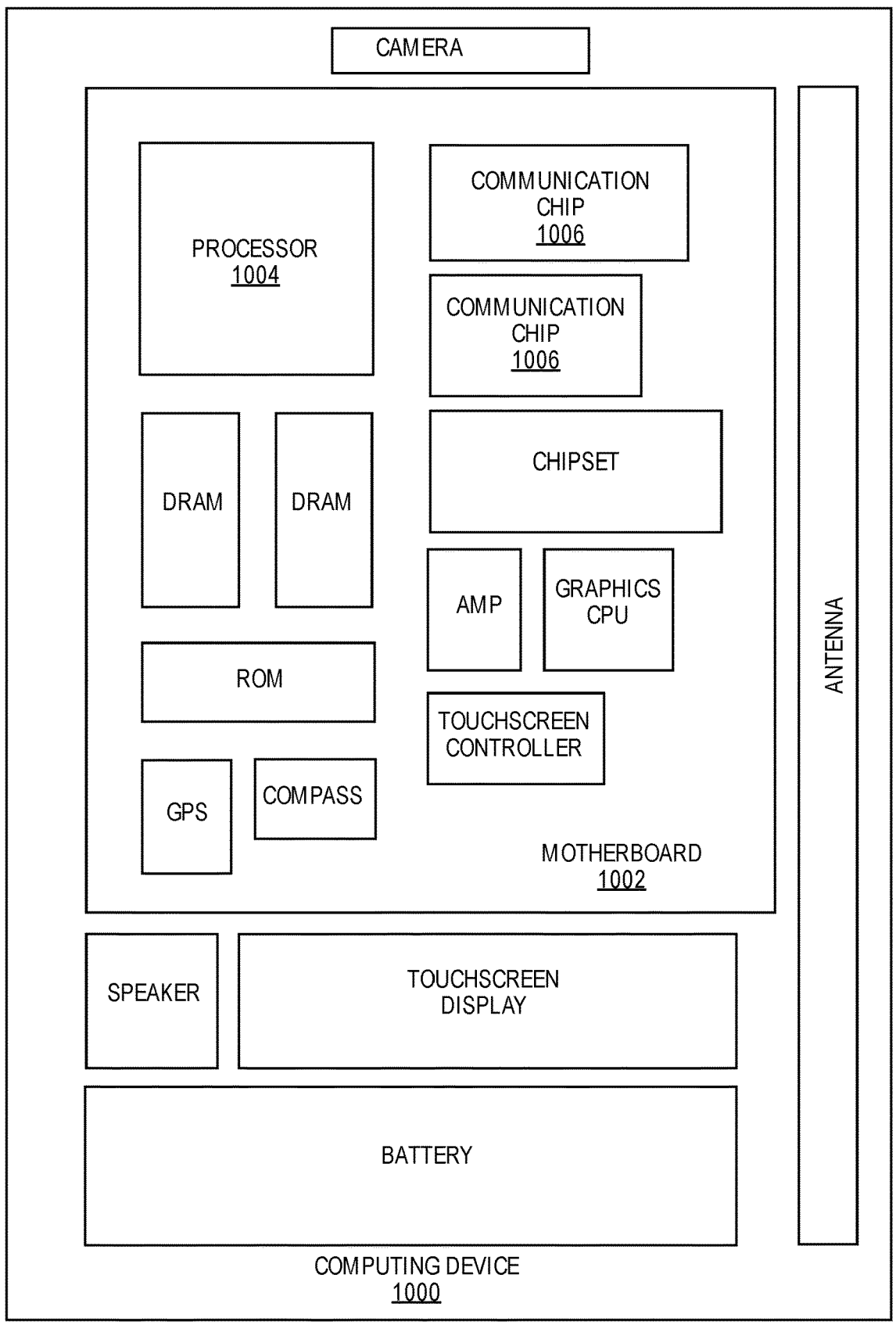
FIG. 10 illustrates a computing device in accordance with one implementation of an embodiment of the present disclosure.

FIG. 10 illustrates a computing device 1000 in accordance with one implementation of an embodiment of the present disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA. TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE. GPRS, CDMA, WiMAX, LTE, Ev-DO, and others.

The processor 1004 of the computing device 1000 includes an integrated circuit die packaged within the processor 1004. The integrated circuit die of the processor 1004 may include one or more structures, such as fin-FET based thin film resistors (TFRs) built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. The integrated circuit die of the communication chip 1006 may include one or more structures, such as fin-FET based thin film resistors (TFRs) built in accordance with implementations of embodiments of the present disclosure.

In further implementations, another component housed within the computing device 1000 may contain an integrated circuit die that includes one or structures, such as fin-FET based thin film resistors (TFRs) built in accordance with implementations of embodiments of the present disclosure.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
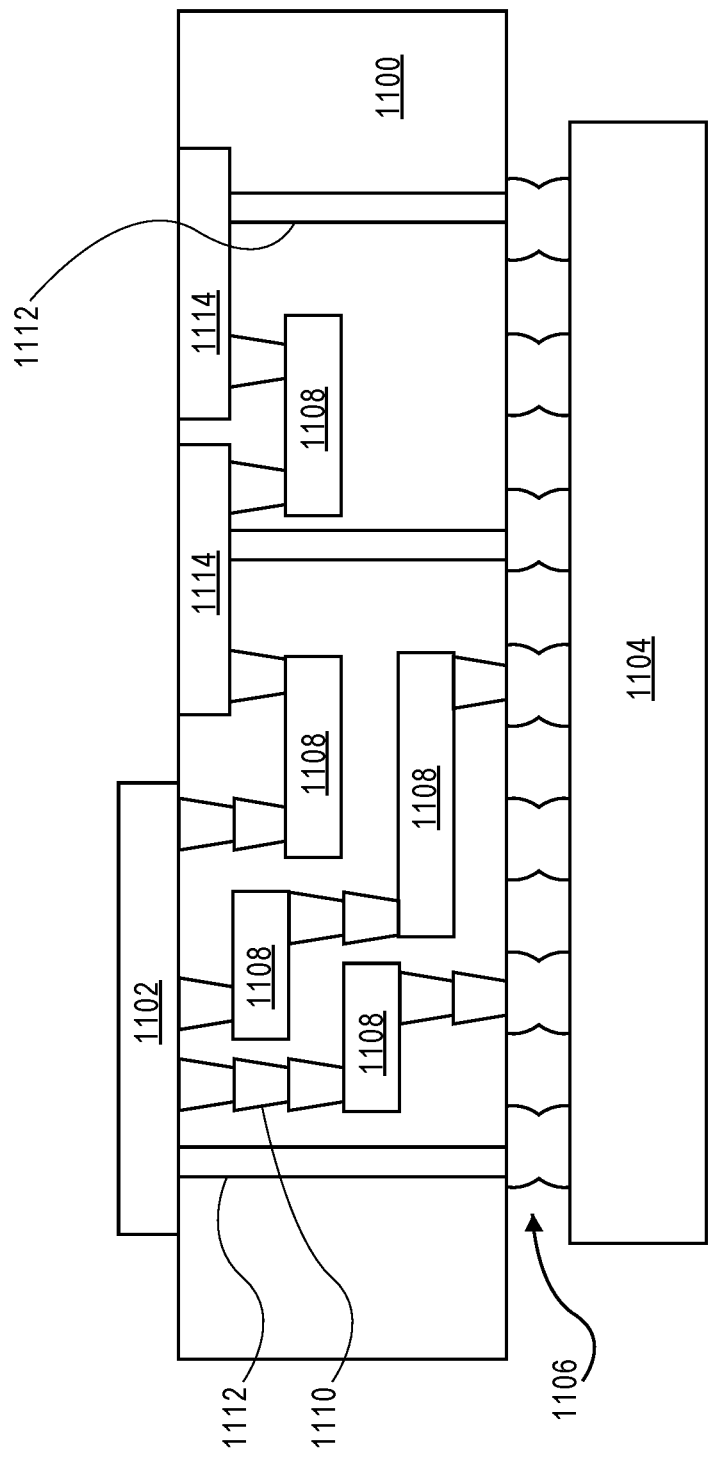
FIG. 11 illustrates an interposer that includes one or more embodiments of the present disclosure.

FIG. 11 illustrates an interposer 1100 that includes one or more embodiments of the present disclosure. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the disclosure, apparatuses or processes disclosed herein may be used in the fabrication of interposer 1100 or in the fabrication of components included in the interposer 1100.

Thus, embodiments of the present disclosure include fin-based thin film resistors and methods of fabricating fin-based thin film resistors.

Example Embodiment 1

An integrated circuit structure includes a fin protruding through a trench isolation region above a substrate. The fin includes a semiconductor material and has a top surface, a first end, a second end, and a pair of sidewalls between the first end and the second end. An isolation layer is conformal with the top surface, the first end, the second end, and the pair of sidewalls of the fin. A resistor layer is conformal with the isolation layer conformal with the top surface, the first end, the second end, and the pair of sidewalls of the fin. A first anode or cathode electrode is electrically connected to the resistor layer. A second anode or cathode electrode is electrically connected to the resistor layer.

Example Embodiment 2

The integrated circuit structure of example embodiment 1, wherein the resistor layer, the anode electrode, and the cathode electrode form a precision thin film resistor (TFR) passive device.

Example Embodiment 3

The integrated circuit structure of example embodiment 1 or 2, wherein the fin is a non-linear fin.

Example Embodiment 4

The integrated circuit structure of example embodiment 1 or 2, wherein the fin is a linear fin.

Example Embodiment 5

The integrated circuit structure of example embodiment 1, 2, 3 or 4, wherein the first anode or cathode electrode is electrically connected to the resistor layer proximate to the first end of the fin, and wherein the second anode or cathode electrode is electrically connected to the resistor layer proximate to the second end of the fin.

Example Embodiment 6

The integrated circuit structure of example embodiment 1, 2, 3 or 4, wherein the first anode or cathode electrode is electrically connected to the resistor layer proximate to the first end of the fin, and wherein the second anode or cathode electrode is electrically connected to the resistor layer distal from the second end of the fin.

Example Embodiment 7

The integrated circuit structure of example embodiment 1, 2, 3 or 4, wherein the first anode or cathode electrode is electrically connected to the resistor layer distal from the first end of the fin, and wherein the second anode or cathode electrode is electrically connected to the resistor layer distal from the second end of the fin.

Example Embodiment 8

The integrated circuit structure of example embodiment 1, 2, 3, 4, 5, 6 or 7, wherein the resistor layer includes titanium nitride (TiN) or tungsten (W).

Example Embodiment 9

The integrated circuit structure of example embodiment 1, 2, 3, 4, 5, 6, 7 or 8, wherein the resistor layer has a resistivity approximately in the range of 100-100,000 ohms/square.

Example Embodiment 10

An integrated circuit structure includes a non-linear fin protruding through a trench isolation region above a substrate. The non-linear fin includes a semiconductor material and has an open structure with a top surface, a first end, a second end, and a pair of sidewalls between the first end and the second end. An isolation layer is conformal with the top surface, the first end, the second end, and the pair of sidewalls of the non-linear fin. A resistor layer is conformal with the isolation layer conformal with the top surface, the first end, the second end, and the pair of sidewalls of the non-linear fin. A first anode or cathode electrode is electrically connected to the resistor layer. A second anode or cathode electrode is electrically connected to the resistor layer.

Example Embodiment 11

The integrated circuit structure of example embodiment 10, wherein the resistor layer, the anode electrode, and the cathode electrode form a precision thin film resistor (TFR) passive device.

Example Embodiment 12

The integrated circuit structure of example embodiment 10 or 11, wherein the first anode or cathode electrode is electrically connected to the resistor layer proximate to the first end of the non-linear fin, and wherein the second anode or cathode electrode is electrically connected to the resistor layer proximate to the second end of the non-linear fin.

Example Embodiment 13

The integrated circuit structure of example embodiment 10 or 11, wherein the first anode or cathode electrode is electrically connected to the resistor layer proximate to the first end of the non-linear fin, and wherein the second anode or cathode electrode is electrically connected to the resistor layer distal from the second end of the non-linear fin.

Example Embodiment 14

The integrated circuit structure of example embodiment 10 or 11, wherein the first anode or cathode electrode is electrically connected to the resistor layer distal from the first end of the non-linear fin, and wherein the second anode or cathode electrode is electrically connected to the resistor layer distal from the second end of the non-linear fin.

Example Embodiment 15

The integrated circuit structure of example embodiment 10, 11, 12, 13 or 14, wherein the resistor layer includes titanium nitride (TiN) or tungsten (W).

Example Embodiment 16

The integrated circuit structure of example embodiment 10, 11, 12, 13, 14 or 15, wherein the resistor layer has a resistivity approximately in the range of 100-100,000 ohms/square.

Example Embodiment 17

An integrated circuit structure includes a non-linear fin protruding through a trench isolation region above a substrate. The non-linear fin includes a semiconductor material and has a closed structure with a top surface, and inner sidewall and an outer sidewall. An isolation layer is conformal with the top surface, the inner sidewall and the outer sidewall of the non-linear fin. A resistor layer is conformal with the isolation layer conformal with the top surface, the inner sidewall and the outer sidewall of the non-linear fin. A first anode or cathode electrode is electrically connected to the resistor layer. A second anode or cathode electrode is electrically connected to the resistor layer.

Example Embodiment 18

The integrated circuit structure of example embodiment 17, wherein the resistor layer, the anode electrode, and the cathode electrode form a precision thin film resistor (TFR) passive device.

Example Embodiment 19

The integrated circuit structure of example embodiment 17 or 18, wherein the resistor layer includes titanium nitride (TiN) or tungsten (W).

Example Embodiment 20

The integrated circuit structure of example embodiment 17, 18 or 19, wherein the resistor layer has a resistivity approximately in the range of 100-100,000 ohms/square.

Example Embodiment 21

A method of fabricating an integrated circuit structure includes forming a backbone template structure on a semiconductor substrate. A sidewall spacer layer is formed conformal with sidewall surfaces of the backbone template structure. A portion of but not all of the sidewall spacer layer is removed to form a patterning mask. The backbone template structure is then removed. Subsequent to removing the backbone template structure, the patterning mask is used to pattern the semiconductor substrate to form a fin protruding from and continuous with the semiconductor substrate. The fin includes a semiconductor material and has a top surface, a first end, a second end, and a pair of sidewalls between the first end and the second end. An isolation layer is formed conformal with the top surface, the first end, the second end, and the pair of sidewalls of the fin. A resistor layer is formed conformal with the isolation layer conformal with the top surface, the first end, the second end, and the pair of sidewalls of the fin. A pair of anode or cathode electrodes is formed, the pair of anode or cathode electrodes electrically connected to the resistor layer.

Example Embodiment 22

The method of example embodiment 21, wherein forming the resistor layer includes using atomic layer deposition (ALD).

Example Embodiment 23

The method of example embodiment 21 or 22, wherein forming the resistor layer includes forming the resistor layer to a thickness in the range of 2-5 nanometers.

Example Embodiment 24

The method of example embodiment 21, 22 or 23, wherein forming the resistor layer includes forming a titanium nitride (TiN) layer or a tungsten (W) layer.

Example Embodiment 25

The method of example embodiment 21, 22, 23 or 24, wherein forming the resistor layer includes forming the resistor layer having a resistivity in the range of 100-100,000 ohms/square.

What is claimed is:

1. An integrated circuit structure, comprising:
    a fin protruding through a trench isolation region above a substrate, the fin comprising a semiconductor material and having a top surface, a first end, a second end, and a pair of sidewall between the first end and the second end;
    an isolation layer conformal with the top surface, the first end, the second end, and the pair of sidewalls of the fin;
    a resistor layer conformal with the isolation layer conformal with the top surface, the first end, the second end, and the pair of sidewalls of the fin;
    a first anode or cathode electrode electrically connected to the resistor layer; and
    a second anode or cathode electrode electrically connected to the resistor layer wherein the first anode or cathode electrode and the second anode or cathode electrode are vertically over the fin.

2. The integrated circuit structure of claim 1, wherein the resistor layer, the anode electrode, and the cathode electrode form a precision thin film resistor (TFR) passive device.

3. The integrated circuit structure of claim 1, wherein the fin is a non-linear fin.

4. The integrated circuit structure of claim 1, wherein the fin is a linear fin.

5. The integrated circuit structure of claim 1, wherein the first anode or cathode electrode is electrically connected to the resistor layer proximate to the first end of the fin, and wherein the second anode or cathode electrode is electrically connected to the resistor layer proximate to the second end of the fin.

6. The integrated circuit structure of claim 1, wherein the first anode or cathode electrode is electrically connected to the resistor layer proximate to the first end of the fin, and wherein the second anode or cathode electrode is electrically connected to the resistor layer distal from the second end of the fin.

7. The integrated circuit structure of claim 1, wherein the first anode or cathode electrode is electrically connected to the resistor layer distal from the first end of the fin, and wherein the second anode or cathode electrode is electrically connected to the resistor layer distal from the second end of the fin.

8. The integrated circuit structure of claim 1, wherein the resistor layer comprises titanium nitride (TiN) or tungsten (W).

9. The integrated circuit structure of claim 1, wherein the resistor layer has a resistivity approximately in the range of 100-100,000 ohms/square.

10. An integrated circuit structure, comprising:
a non-linear fin protruding through a trench isolation region above a substrate, the non-linear fin comprising a semiconductor material and having an open structure with a top surface, a first end, a second end, and a pair of sidewalls between the first end and the second end;
an isolation layer conformal with the top surface, the first end, the second end, and the pair of sidewalls of the non-linear fin;
a resistor layer conformal with the isolation layer conformal with the top surface, the first end, the second end, and the pair of sidewalls of the non-linear fin;
a first anode or cathode electrode electrically connected to the resistor layer; and
a second anode or cathode electrode electrically connected to the resistor layer wherein the first anode or cathode electrode and the second anode or cathode electrode are vertically over the non-linear fin.

11. The integrated circuit structure of claim 10, wherein the resistor layer, the anode electrode, and the cathode electrode form a precision thin film resistor (TFR) passive device.

12. The integrated circuit structure of claim 10, wherein the first anode or cathode electrode is electrically connected to the resistor layer proximate to the first end of the non-linear fin, and wherein the second anode or cathode electrode is electrically connected to the resistor layer proximate to the second end of the non-linear fin.

13. The integrated circuit structure of claim 10, wherein the first anode or cathode electrode is electrically connected to the resistor layer proximate to the first end of the non-linear fin, and wherein the second anode or cathode electrode is electrically connected to the resistor layer distal from the second end of the non-linear fin.

14. The integrated circuit structure of claim 10, wherein the first anode or cathode electrode is electrically connected to the resistor layer distal from the first end of the non-linear fin, and wherein the second anode or cathode electrode is electrically connected to the resistor layer distal from the second end of the non-linear fin.

15. The integrated circuit structure of claim 10, wherein the resistor layer comprises titanium nitride (TiN) or tungsten (W).

16. The integrated circuit structure of claim 10, wherein the resistor layer has a resistivity approximately in the range of 100-100,000 ohms/square.

17. An integrated circuit structure, comprising:
a non-linear fin protruding through a trench isolation region above a substrate, the non-linear fin comprising a semiconductor material and having a closed structure with a top surface, and inner sidewall and an outer sidewall;
an isolation layer conformal with the top surface, the inner sidewall and the outer sidewall of the non-linear fin;
a resistor layer conformal with the isolation layer conformal with the top surface, the inner sidewall and the outer sidewall of the non-linear fin;
a first anode or cathode electrode electrically connected to the resistor layer; and
a second anode or cathode electrode electrically connected to the resistor layer wherein the first anode or cathode electrode and the second anode or cathode electrode are vertically over the non-linear fin.

18. The integrated circuit structure of claim 17, wherein the resistor layer, the anode electrode, and the cathode electrode form a precision thin film resistor (TFR) passive device.

19. The integrated circuit structure of claim 17, wherein the resistor layer comprises titanium nitride (TiN) or tungsten (W).

20. The integrated circuit structure of claim 17, wherein the resistor layer has a resistivity approximately in the range of 100-100,000 ohms/square.

21. A method of fabricating an integrated circuit structure, the method comprising:
forming a backbone template structure on a semiconductor substrate;
forming a sidewall spacer layer conformal with sidewall surfaces of the backbone template structure;
removing a portion of but not all of the sidewall spacer layer to form a patterning mask;
removing the backbone template structure;
subsequent to removing the backbone template structure, using the patterning mask to pattern the semiconductor substrate to form a fin protruding from and continuous with the semiconductor substrate:
the fin comprising a semiconductor and having a top surface, a first end, a second end, and a pair of sidewalls between the first end and the second end;
forming an isolation layer conformal with the top surface, the first end, the second end, and the pair of sidewalls of the fin;
forming a resistor layer conformal with the isolation layer conformal with the top surface, the first end, the second end, and the pair of sidewalls of the fin; and
forming a pair of anode or cathode electrodes electrically connected to the resistor layer, wherein the pair of anode or cathode electrodes is vertically over the fin.

22. The method of claim 21, wherein forming the resistor layer comprises using atomic layer deposition (ALD).

23. The method of claim 21, wherein forming the resistor layer comprises forming the resistor layer to a thickness in the range of 2-5 nanometers.

24. The method of claim 21, wherein forming the resistor layer comprises forming a titanium nitride (TiN) layer or a tungsten (W) layer.

25. The method of claim 21, wherein forming the resistor layer comprises forming the resistor layer having a resistivity of 100-100,000 ohms/square.

* * * * *